Figure 1:
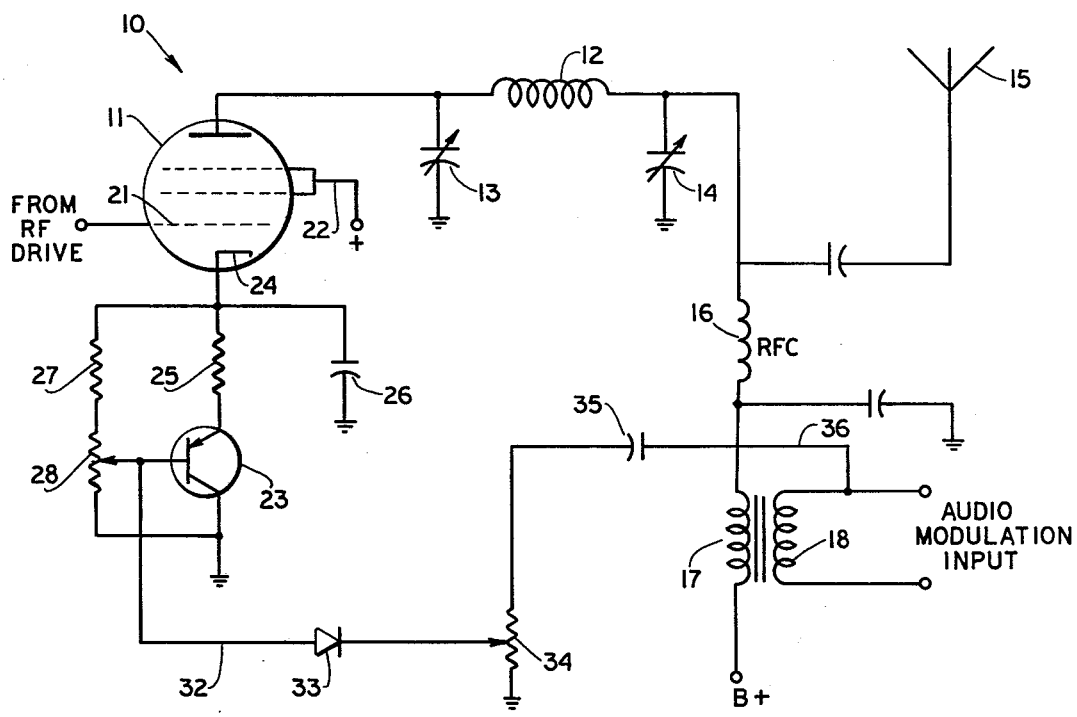

United States Patent [19]

Alderman

[11] 4,058,769
[45] Nov. 15, 1977

[54] MODULATION SYSTEM WITH CARRIER CONTROL

[76] Inventor: Robert J. Alderman, Rte. 1, Box 205E, Ruskin, Fla. 33570

[21] Appl. No.: 486,119

[22] Filed: July 5, 1974

[51] Int. Cl.² .............................................. H04B 1/04
[52] U.S. Cl. .................................... 325/144; 325/182; 325/187
[58] Field of Search ................ 325/144, 182, 136–138, 325/327–331, 159, 186, 187, 139, 105; 332/31 R, 31 T, 38, 59, 37 R, 37 D

[56] References Cited

U.S. PATENT DOCUMENTS

| 2,063,278 | 12/1936 | Von Wedel | 325/144 X |
| 2,243,221 | 5/1941 | Quilter | 325/144 X |
| 3,260,966 | 7/1966 | Murray | 325/144 |
| 3,335,370 | 8/1967 | Wittig et al. | 325/105 |

FOREIGN PATENT DOCUMENTS

| 19,690 | 10/1934 | Australia | 325/144 |
| 105,149 | 9/1938 | Australia | 325/144 |

OTHER PUBLICATIONS

Radio Engineers' Handbook, Terman, pp. 531–532, 547, 548, copyright 1943.

Primary Examiner—Benedict V. Safourek
Assistant Examiner—Michael A. Masinick
Attorney, Agent, or Firm—Jones, Thomas & Askew

[57] ABSTRACT

System for controlling the magnitude of an RF carrier signal that is concurrently being amplitude-modulated, whereby there is provided an amplitude-modulated signal that is compatible for reception either as a conventional AM signal or as an SSB signal. The instantaneous power of a carrier signal is adjusted in response to the instantaneous power of a modulation signal available to modulate the carrier signal. The carrier signal power is allowed to fluctuate between a maximum value and a minimum or no-modulation value, which may provide a minimum carrier level notwithstanding the absence of a modulating signal.

19 Claims, 2 Drawing Figures

MODULATION SYSTEM WITH CARRIER CONTROL

This invention relates in general to communication systems and in particular to a method and apparatus of generating amplitude-modulated (AM) carrier signals.

The use of a conventional amplitude-modulated RF carrier signal to transmit audio or other information is well-known to those skilled in the art. Conventional AM communication has found widespread application in many applications, the most well-known of which are in the broadcasting of radio signals, the video portion of television signals, and many types of radio communication systems.

Conventional AM modulation presents some operational disadvantages, however, particularly as used in two-way communication. Two currently popular forms of AM transmission, namely, double-sideband (DSB) and single-sideband (SSB) are basically incompatible in reception, as is known to those in the art. The missing carrier in an SSB transmission must be reinserted at the receiver by a local or beat-frequency oscillator, and objectionable heterodynes are produced if a conventional DSB signal carrier is received unless the beat-frequency oscillator is inactivated. Similarly, an SSB signal is unintelligible when received on a receiver which lacks a beat-frequency oscillator for carrier reinsertion, or on which the beat-frequency oscillator is not turned on. Practically speaking, the operational incompatibility of DSB and SSB modes of AM transmission means that a communications network can accommodate both DSB and SSB transmissions only with a great deal of difficulty in reception, especially where the transmissions are of relatively short duration and do not provide a listener with sufficient time to energize or de-energize a beat-frequency oscillator (if available) in his receiver.

Proposed solutions attempting to overcome the incompatibility of DSB and SSB operation have generally involved the use of voice-operated relays (VOX) to control the carrier signal, so that the carrier is automatically turned on in response to the first syllable of speech and remains on until speech is terminated. VOX circuits generally require some degree of delayed carrier turn-off, so that the carrier will not be repeatedly interrupted in response to the pauses which frequently occur during normal speech patterns. This carrier hold-over, along with the fact that VOX circuits tend to have an inherent starting delay which clips or loses one or more initial syllables of speech, make voice-operated control less than satisfactory for most users in DSB communication, although the absence of a carrier signal in SSB transmission makes VOX operation usable and popular for that purpose. Even where VOX control has been used with conventional DSB AM transmissions, moreover, the basic problem of incompatible reception of the two signal types substantially remains.

Accordingly, it is an object of the present invention to provide an improved AM modulation system.

It is another object of the present invention to provide an AM modulation system capable of transmitting modulated signals which are compatibly receivable on either an SSB receiver or a double-sideband receiver.

It is yet another object of the present invention to provide an AM modulation system in which the power of the carrier signal is determined by the power of the modulation signal instantaneously available to modulate the carrier signal.

Figure 2:
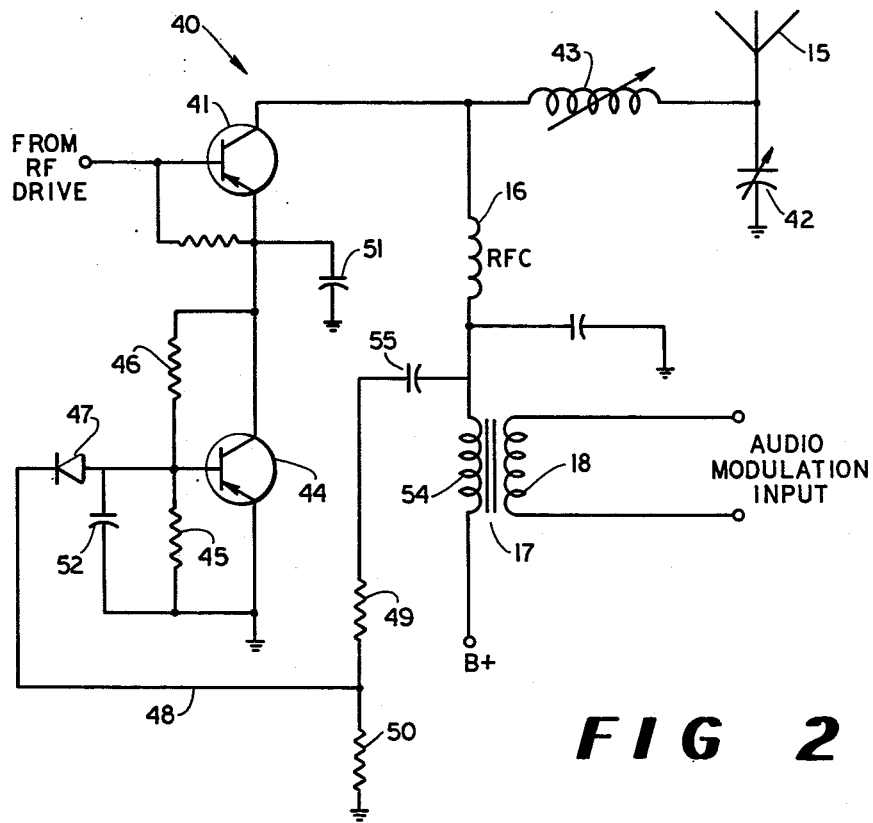

Other objects and many of the attendant advantages of the present invention will become more readily apparent from the following description of disclosed embodiments of the invention, wherein:

FIG. 1 is a schematic diagram of a first embodiment of a modulation system according to the present invention; and FIG. 2 is a schematic diagram of another disclosed embodiment of a modulation system according to the present invention.

Stated in general terms, the method and apparatus of the present invention involves amplitude-modulating a carrier signal in an appropriate manner, while simultaneously adjusting the power of the carrier signal as a function of the instantaneous modulation power which is applied to modulate the carrier signal. Stated more particularly, the instantaneous power of the carrier signal is adjusted, according to the present invention, in proportion to the power of the modulation signal which is instantaneously available for modulating the carrier signal, so that the power of the carrier signal at any time does not exceed the carrier signal power which is 100% modulated by the power in the modulation signal at that same time. Since the carrier power falls to zero, or to a relatively low power level if desired, during periods of no modulation, modulated signals according to the present invention can be received and detected on SSB receivers without the interference that is customary with conventional DSB unsuppressed-carrier systems. Moreover, the present system transmits both upper and lower sidebands and a carrier signal during periods of modulation, so that the transmitted signal can be received and demodulated in a conventional AM receiver.

Stated more particularly, and with reference taken to the embodiment of the present invention as depicted in FIG. 1, there is shown generally at 10 the power amplifier stage of a plate-modulated AM transmitter including an output amplifier tube 11, a pi-output tuned circuit including the tank coil 12 and the variable capacitors 13 and 14, and the antenna 15. The pi-network is connected through an RF choke 16 and the secondary winding of a modulation transformer 17 to receive a suitable source of B+ voltage. The primary winding 18 of the modulation transformer 17 is connected to receive a suitable source of audio modulation power in accordance with conventional high-level AM plate modulation practice.

The control grid 21 of the output tube 11 is connected to receive RF drive from any suitable source, such as an oscillator or a buffer stage. A suitable source of high voltage is connected on the line 22 to the other grids of the tube 11.

Turning to the cathode circuit of the tube 11, it is seen that the control transistor 23 is connected in series between the cathode 24 and ground. The cathode 24 is connected through the resistance 25 to the emitter of the transistor 23, and the capacitance 26 is connected to the cathode to provide RF bypass for the cathode circuit and for an additional purpose described below. The control transistor 23 is provided with a self-bias circuit comprising a voltage divider made up of the fixed resistance 27 and the potentiometer 28, the center tap of which is connected to the base of the transistor 23.

The base of the transistor 23 is also connected through the line 32 and the diode 33 to another potentiometer 34, which is connected through the DC blocking capacitance 35 to receive the modulation signal supplied to the primary winding 18 of the modulation transformer 17. It will be seen in FIG. 1 that the line 36 is connected to one end of the primary winding 18, although those skilled in the art will appreciate that the line 36 could be connected to either end of a balanced-input primary winding associated with a push-pull modulator.

Considering the operation of the embodiment depicted in FIG. 1, assume that all operating voltages and RF drive are applied to the output circuit 10, and that no modulation is present. The potentiometer 28 is adjusted so that the tube 11 is biassed at or slightly above cutoff. It will be understood that biassing the tube slightly above cutoff allows a relatively low-power RF carrier to be transmitted, an operational situation which may be desired in some applications. When a modulation signal is applied to the primary winding 18 of the modulation transformer 17, the modulation-produced voltage developed across the potentiometer 34 is rectified by the diode 33 and applied to the base of the transistor 23, with the polarity of the diode 33 being chosen in combination with the transistor 23 type (PNP, in the disclosed embodiment) so that only the negative-going portion of the modulation signal is applied to the transistor. The rectified audio voltage signal determined by the setting of the potentiometer 34 is applied to the control transistor 23 and increases the conductivity of the control transistor, allowing more current to flow through the cathode circuit of the tube 11 and accordingly increasing the power of the carrier signal delivered by the power amplifier circuit 10. This carrier signal is amplitude-modulated in the conventional manner, in accordance with the modulation signal induced in the secondary winding of the modulation transformer 17.

While the capacitance 26 in the cathode circuit of the tube 11 functions to provide RF bypass of the cathode circuit, in a manner well-known to those skilled in the art, the capacitance 26 in the disclosed embodiment of the present invention provides the additional function of preventing the current flowing through the cathode circuit, which is increased in response to the negative-going portion of a cycle of the modulation signal, from returning instantaneously to the unmodulated value of cathode current in response to the positive-going portion of each cycle in an audio modulation signal. The capacitance 26 is charged to a level determined by the cathode current, during each negative-going portion of a cycle of audio modulation, and the charge on the capacitance 26 provides a reference to which operation of the tube 11 is held during each following positive-going portion of the modulation signal. The value of the holdover capacitance 26 is selected to provide a time constant in the cathode circuit which approximately corresponds to the period of a frequency within the range of modulation frequencies expected to be transmitted by the output stage 10. In the case of an output stage intended primarily for speech communication, an appropriate time constant of the cathode circuit is provided by a cathode capacitance 26 of one microfarad, in association with a resistance 25 of 220 ohms.

It will be understood that the foregoing specific example of resistance and capacitance is by way of example only, and is not limiting to the present invention. If the time constant provided by the cathode capacitance 26 is too great, however, the carrier hold-over resulting from the time constant will be modulated less than 100% and will also provide unwanted carrier heterodynes following termination of modulation. While even an optimum value of cathode capacitance 26 allows some extend of carrier power fall-off to occur during the positive-going half of each audio cycle, the appropriate choice of cathode capacitance as discussed hereinabove prevents such fall-off from providing any observable effects in the transmitted signal, either as received or as viewed in an oscilloscope.

It is important to the operation of the present invention that the potentiometer 34 be properly adjusted so as to avoid either over-modulation or under-modulation of the signal provided by the circuit 10. Those skilled in the art recognize that 100% modulation of an amplitude-modulated carrier is provided when the power of the modulation signal is exactly 0.5 times the power of the carrier signal. Accordingly, the potentiometer 34 should be adjusted to cause the tube 11 to provide an optimum carrier signal at an instantaneous power which is at least twice as great as the instantaneous power of the audio modulation signal which is available to modulate the carrier signal. If the control voltage supplied through the diode 33 to the transistor 23 is greater than the optimum amount, the carrier power will lead the available audio modulation power with the result that less than 100% modulation occurs. If the control signal supplied to the transistor 23 is less than optimum, on the other hand, the resulting instantaneous carrier power will also be too low and the carrier will be over-modulated by the available audio modulation power, resulting in splatter and other unwanted effects. Since the optimum setting of the potentiometer 34 necessary to accomplish exactly 100% modulation at all times may be difficult to obtain, in practice, it is preferred to adjust the potentiometer 34 so that the carrier power slightly leads the modulation power.

The circuit shown in FIG. 2 shows basically the same type of modulation carrier control applied to an all-solid state power amplifier output stage indicated generally at 40 and having a power amplifier transistor 41 connected to receive a suitable source of RF drive. The antenna 15 is coupled to the output transisor 41 through a tuned circuit which may include the variable capacitance 42 and the variable inductance 43. The high-level modulation circuit including the modulation transformer 17 is basically the same as shown and described with respect to FIG. 1.

Carrier control of the embodiment shown in FIG. 2 is provided by the control transistor 44 connected in series between the emitter of the output transistor 41 and ground. The control transistor 44 is provided with a fixed bias circuit including the voltage dividing resistances 45 and 46 which are selected to bias the output transistor 41 at or slightly above cutoff. It will be understood, however, that the control transistor 44 may alternatively be adjustably biassed through the provision of a potentiometer corresponding to the potentiometer 28 in the embodiment of FIG. 1.

The modulation control signal to the control transistor 44 is supplied to the base of the control transistor through the diode 47, the line 48, and the voltage divider provided by the resistors 49 and 50. The audio signal is supplied to the voltage dividing resistances 49 and 50 from the secondary winding 54 of the modulation transformer 17, through the DC blocking capacitance 55. The connection of the modulation control signal voltage divider to the secondary of the modulation transformer, in the embodiment shown in FIG. 2, illustrates that the specific source of the modulation-responsive control signal is not critical to the present invention, provided that the control transistor 44 receives a modulation-responsive control signal which allows the carrier power provided by the power amplifier transistor 41 to be controlled in accordance with the available modulation power. Although the fixed voltage divider including the resistances 49 and 50 is provided in the embodiment shown in FIG. 2, it will be understood that an adjustable voltage divider may be provided corresponding with the potentiometer 34 in the circuit of FIG. 1. The maximum amount of power delivered by the circuit 10 is obtained when the control transistor is at maximum conductivity, and such maximum power is determined by conventional consideration of operating voltage and current for the tube 11. The modulation power should not exceed the power necessary for 100% modulation at maximum carrier power.

The capacitance 51 in the circuit of FIG. 2 provides the same function and is chosen with the same consideration as the holdover capacitance 26 of FIG. 1. Holdover operations can also be provided with the capacitance 52 connected between the base and the emitter of the control transistor 44.

Tests conducted with modulation circuitry according to the present invention have shown that such circuits provide an amplitude-modulated carrier signal which is intelligibly receivable either on a conventional AM receiver or on a receiver operated to receive SSB signals. The level of received signals fluctuates in response to modulation, as would be expected in view of the modulation-responsive control of the carrier amplitude. The received signal, consisting of a carrier signal and both sidebands, is demodulated by the AM receiver in the usual manner to provide a clearly-intelligible audio signal. When received on an SSB receiver, the presence of a carrier signal from the transmitting circuit of the present invention does provide some degree of beat-frequency oscillation. Such oscillation is at a relatively low level relative to the demodulated audio, however, because the heterodyne-causing carrier power always maintains a fixed relation to the modulation power. These oscillations can be readily tuned out with minor tuning and/or beat-frequency oscillator adjustments of the receiver. An important and surprising result of the present modulating circuit is that signals from the present circuit can be intelligibly received on SSB receivers interchangeably with signals from a conventional SSB transmitter, allowing a person to communicate compatibly with transmissions from the present apparatus and from an SSB transmitter without requiring constant adjustment of the receiver.

It is preferable that the carrier signal track the audio modulation signal rapidly and with little or no delay, since unwanted objectionable heterodynes in an SSB receiver are caused by the lingering presence of a carrier signal after modulation ceases. Although the control transistor can be biassed to maintain the RF power amplifier completely cut off under quiescent or no-modulation conditions, it has been found that a quiescent-modulation carrier may be maintained at up to approximately 10% of the maximum or full-power carrier, without providing objectionable heterodyne effects in SSB receivers. This quiescent carrier obviously will provide no adverse effects when received by an AM receiver.

It will be understood that the foregoing relates only to preferred embodiments of the present invention, and that numerous alterations or modifications may be made therein without departing from the spirit or the scope of the invention as defined in the following claims.

What is claimed is:

1. The method of generating a modulated carrier signal, comprising the steps of:
    generating a carrier signal;
    generating a modulation signal;
    modulating said carrier signal with said modulation signal; and
    concurrent with said step of modulating, adjusting the power of said carrier signal in proportion to the instantaneous power of said modulating signal so that the instantaneous power of said carrier signal is proportional to the power of said modulation signal which is available to modulate said carrier signal, said instantaneous power of said carrier signal being at least sufficient to avoid overmodulation by said instantaneous power of said modulating signal.

2. Method as in claim 1, wherein the instantaneous power of said carrier signal is adjusted to be at least twice as great as the instantaneous power of said modulating signal.

3. The method of claim 1, wherein the power of said carrier signal is substantially immediately reduced to a predetermined minimum power in response to the absence of said modulation signal.

4. Method as in claim 1, wherein the instantaneous power of said carrier signal is proportionately adjustable from a predetermined minimum amount of power, in the absence of said modulation signal, to a predetermined maximum amount of power in response to a modulation signal at least of sufficient power to provide 100% modulation of said maximum carrier signal.

5. Method as in claim 1, wherein said carrier signal is an RF carrier signal and said modulation signal is an audio modulation signal.

6. The method as in claim 1, wherein the power of said carrier signal is decreased to zero in the absence of said modulation signal.

7. Apparatus as in claim 6, wherein:
    said carrier generating means is operative to generate an RF carrier signal; and
    said modulating means is operative in response to an audio frequency modulation signal to modulate the amplitude of said RF carrier signal.

8. Apparatus as in claim 6, wherein:
    said carrier generating means comprises an amplification element having an input circuit to receive an RF input signal and a signal output circuit on which an amplified RF carrier signal is present;
    said modulating means is connected to said signal output circuit of said amplification element to modulate said amplified RF carrier signal; and
    said control circuit means is connected to said input circuit of said amplification element.

9. Apparatus as in claim 8, wherein:
    said control circuit means includes a control element connected in said input circuit and selectively operative to adjust the power of said amplified RF carrier signal present on said signal output circuit; and
    means supplying an input signal to said control element from said modulating means so that said control element provides the aforesaid instantaneous adjustment of the power of said amplified RF carrier signal in response to the power of said modulating signal.

10. Apparatus as in claim 9, further comprising diode means in circuit with the input signal to said control element to rectify said modulating signal supplied to control the power of said amplified RF carrier signal.

11. Apparatus as in claim 10, further comprising a capacitance connected to receive a charge which is proportional to said rectified modulation signal so that only modulation signals of a first polarity adjust the instantaneous power of the carrier signal, so that the amount of charge on said capacitance adjusts the instantaneous power of the carrier signal during each following modulation signal half-cycle of a second polarity.

12. The method of generating a modulated carrier signal, comprising the steps of:
generating a modulation signal,
concurrently generating a carrier signal whose power is substantially proportional to the instantaneous power of said modulation signal in a predetermined relation, so that the power of said concurrently generated carrier signal is determined by the instantaneous power of said modulation signal and is at least sufficient to avoid overmodulation by the instantaneous power of said concurrent modulation signal; and
modulating said carrier signal with said modulation signal.

13. The method of claim 12 in which said modulation signal comprises first and second kinds of signal components, and further comprising the steps of:
controlling the power of said carrier signal during the occurrence of each said first kind of modulation signal component in response to the instantaneous power of such modulation signal component; and
controlling of said carrier signal during the occurrence of each said second kind of modulation signal component as a function of the instantaneous power of the preceding modulation signal component of said first kind.

14. The method of claim 13, wherein one of said first and second kinds of modulation signal components are positive-going signals and the other of said kinds of modulation signal components are negative-going signals.

15. Apparatus for generating a modulated signal, comprising:
means operative to generate a carrier signal;
means operative in response to a modulation signal to modulate said carrier signal; and
control circuit means operatively connected to said carrier signal generating means and operative in response to the instantaneous power of said modulation signal to adjust the power of the carrier signal to a power which is in predetermined proportion to said instantaneous power of said modulation signal and which is at least sufficient to avoid being overmodulated by said instantaneous power of said modulation signal.

16. Apparatus for generating a modulated signal, comprising:
means for generating a carrier signal;
means responsive to a modulation signal for modulating the amplitude of said carrier signal; and
control means operatively associated with said carrier signal generating means and operative in response to the instantaneous power of said modulation signal to substantially instantaneously adjust the concurrent power of said carrier signal in a predetermined relation to the instantaneous power of said modulation signal, so that said concurrent carrier signal power is determined by said instantaneous power of said modulation signal and is at least sufficient to avoid being overmodulated by said instantaneous power of the modulation signal.

17. Apparatus as in claim 16, in which said modulation signal includes a first kind of signal portion and a second kind of signal portion, and wherein said control means includes:
first means responsive to a selected one kind of modulation signal portion to control the concurrent instantaneous power of said carrier signal in response to the instantaneous power of that selected modulation signal portion; and
second means responsive to said instantaneous power of said one kind of signal portion to provide a carrier power control signal which determines the power of said carrier signal during a subsequently-occuring other kind of modulation signal portion.

18. Apparatus as in claim 17, wherein said first and second kinds of modulation signals comprise positive-going and negative-going half-cycles of modulation signals, and said second means includes storage means responsive to the amplitude of said selected one kind of modulation signal portion to provide said carrier power control signal for controlling carrier power during the next half-cycle of modulation.

19. Apparatus as in claim 18, wherein said storage means comprises a capacitance which is operative to receive a charge during modulation signal half-cycles of a certain kind, said charge being proportional to the instantaneous amplitude of such modulation signal half-cycle, the amount of said charge providing said carrier power control signal which determines the instantaneous power of said carrier signal during the next following half-cycle of modulation.

* * * * *

UNITED STATES PATENT OFFICE
CERTIFICATE OF CORRECTION

PATENT NO. : 4,058,769

DATED : November 15, 1977

INVENTOR(S) : Robert J. Alderman

It is certified that error appears in the above-identified patent and that said Letters Patent are hereby corrected as shown below:

Column 6, line 41, the claim reference numeral "6" should read --15--

Column 6, line 47, the claim reference numeral "6" should be --7--

Signed and Sealed this

Seventh Day of March 1978

[SEAL]

Attest:

RUTH C. MASON
Attesting Officer

LUTRELLE F. PARKER
Acting Commissioner of Patents and Trademarks

Disclaimer

4,058,769.—*Robert J. Alderman,* Ruskin, Fla. MODULATION SYSTEM WITH CARRIER CONTROL. Patent dated Nov. 15, 1977. Disclaimer filed June 10, 1981, by the inventor.

Hereby enters this disclaimer to claims 1–15 of said patent.
*[Official Gazette August 11, 1981.]*